United States Patent

Furuta

[11] Patent Number: 5,814,860
[45] Date of Patent: Sep. 29, 1998

[54] SEMICONDUCTOR IC DEVICE HAVING FIRST AND SECOND PADS ON SURFACE OF SEMICONDUCTOR CHIP

[75] Inventor: Kenichi Furuta, Tokyo, Japan

[73] Assignee: Oki Electric Industry Co., Ltd., Tokyo, Japan

[21] Appl. No.: 804,828

[22] Filed: Feb. 24, 1997

[30] Foreign Application Priority Data

Oct. 2, 1996 [JP] Japan ................................... 8-261781

[51] Int. Cl.[6] .............................. H01L 29/76; H01L 29/94
[52] U.S. Cl. ........................... 257/335; 257/342; 257/401
[58] Field of Search .................................. 257/335, 337, 257/341, 342, 401, 520, 501, 502

[56] References Cited

U.S. PATENT DOCUMENTS 5,592,026  1/1997  Frisina et al. ........................... 257/341

Primary Examiner—Wael Fahmy
Attorney, Agent, or Firm—Jones & Volentine, L.L.P.

[57] ABSTRACT

A semiconductor IC device which does not incur a decrease in the dielectric strength by a leakage current flowing over the surface of the semiconductor device, the IC device comprising:

a semiconductor chip including a first function region, a second function region, and a third function region, wherein a current flowing through the third function region by an electric signal input to the first function region; and a first and a second pad provided on the surface of the semiconductor chip, and serving as electric connectors for the first and second function regions, wherein when there is no electric signal input to the first region, a depletion region is so formed as to surround the first and second function regions between the first and second function regions, and the third function region to improve the dielectric strength between the first and second function regions and the third function region, and wherein the first and second pads are so arranged as to be close to each other substantially in the center of the surface of the semiconductor chip.

21 Claims, 6 Drawing Sheets

SEMICONDUCTOR IC DEVICE HAVING FIRST AND SECOND PADS ON SURFACE OF SEMICONDUCTOR CHIP

BACKGROUND OF THE INVENTION

1. Field of the Invention

The present invention relates to a semiconductor IC device, and more particularly to a semiconductor IC device with a high dielectric strength as in the insulated gate FET (IGFET).

2. Prior Art

In its basic structure, a MOS FET (metal-oxide-semiconductor field effect transistor) includes a so-called MOS capacitor formed by a silicon substrate and a gate arranged on the silicon substrate through the intermediary of a gate oxide film, and a source for supply of carriers and a drain for taking out the carriers.

In the category of MOS FETs, there is a conventional device shown in FIGS. 5 to 8, for example, which exhibits a dielectric strength higher than about 1000 V.

FIGS. 5 and 6 are a plan view and a cross sectional view respectively showing the basic structure of a conventional semiconductor IC device called a VDMOS FET (vertical double-diffused MOS FET).

In the conventional VDMOS FET shown in FIGS. 5 and 6, a dual well structure is adopted, which includes a first well portion 3 (see FIG. 6) in the silicon substrate and a second well portion 4 (see FIG. 6) in the first well portion 3, these wells being successively formed by double diffusion of impurities into the silicon substrate 2. If a dual well structure is expressed as a cell 5, a plurality of cells 5 are arranged in the center of the silicon substrate 2.

In the peripheral area of the silicon substrate 2, a pair of pads 6 and 7 are provided, and the surface of the silicon substrate 2 is protected by a passivation film 8 which leaves the pads 6 and 7 exposed, and a peripheral area of the silicon substrate 2 also exposed.

A gate is arranged on each of the first well portions 3 through the intermediary of a gate oxide film, not shown. A source is formed in each of the second well portions 4. A drain electrode 9 for the drain, composed of the body of the silicon substrate 2, is formed on the reverse side of the silicon substrate 2. The gates of the cells 5 are collectively connected to one pad 6, while the sources, that is, the second well portions 4 are collectively connected to the other pad 7.

When a voltage is not applied to the gates, the depletion layer 10 to increase the dielectric strength between the drain and the source is formed in such a way as to surround all well structures, that is, the cells 5 in the silicon substrate 2. In addition, a field plate 11, which serves to improve the dielectric strength by expanding the depletion layer 10, is disposed between the surface of the silicon substrate 2 and the passivation layer 8.

Bonding wires 12 extend from the pads 6 and 7 to external terminals, not shown.

According to this VDMOS 1, on account of the presence of the depletion layer 10, even if a voltage of 1000 V, for example, is applied between the drain and the source, a direct dielectric breakdown between drain and source is certainly prevented so long as a gate voltage is not applied to the gate.

However, as shown in FIG. 6, the pads 6 and 7 are arranged so close to the peripheral edge of the silicon substrate 2 as to be adjacent to the field plate 11 to shorten the length of the bonding wires 12 for reasons of installation of the bonding wires 12 led outward from the silicon substrate Therefore, the space between the pads 6 and 7, and the grid line 13 of the silicon substrate 2 extending beyond the peripheral edge of the passivation film 8 becomes relatively small.

Accordingly, to give an example, when the source and the gate are grounded and a positive voltage of about 1000 V is applied to the drain, it can happen that a leakage current flows from the grid line 13 of the body of the silicon substrate 2 to the pads 6 and 7 through the surface of the passivation film 8.

FIGS. 7 and 8 are respectively a plan view and a cross sectional view showing the basic structure of a conventional semiconductor IC device called a high voltage IC bipolar transistor (dielectric strength: about 1000 V).

A dual well structure is adopted for this bipolar transistor 20, which basically includes a first well portion 23 (see FIG. 8) in the silicon substrate and a second well portion 24 (see FIG. 8) in the first well portion, successively formed by double diffusion of impurities into the silicon substrate 22 as in the VDMOS 1 shown in FIGS. 5 and 6. If each dual well structure is called a cell 25, a plurality of cells 25 are arranged in the center of the silicon substrate 22.

A base is formed in each first well portion 23, and an emitter is formed in each second well portion 24. A collector electrode 29 for the collector region, composed of the body of the silicon substrate 22, is formed on the reverse side of the silicon substrate 22. The bases of the cells 25 are collectively connected to one pad 26 as the combined base, and the emitters of the cells 25 are collectively connected to the other pad 27 as the combined emitter.

When a current does not flow through the base, a depletion layer 30 to increase the dielectric strength between the collector and the base is so formed as to surround all cells 25 in the silicon substrate 22 as in the example shown in FIG. 6. Moreover, a field plate 31, which serves to improve the dielectric strength, is arranged between the surface of the silicon substrate 22 and the passivation film 28.

According to this transistor 20, owing to the presence of the depletion layer 30, even if a voltage of 1000 V, for example, is applied between the base and the collector, a direct dielectric breakdown is certainly prevented so long as a current does not flow between base and emitter.

However, if the pads 26 and 27 are arranged so close to the peripheral edge of the silicon substrate 22 as to be adjacent to the field plate 31 to shorten the length of the bonding wires 32 for reasons of installation of the bonding wires 32 led outward from the silicon substrate 22, the space between the pads 26 and 27, and the grid line 33 of the silicon substrate 22 extending beyond the peripheral edge of the passivation film 28 becomes relatively small.

Consequently, when the base is grounded and a positive voltage of about 1000 V is applied between the base and the collector, for example, it can happen that a leakage current flows from the grid line 33 of the body of the silicon substrate 22 to the pads 26 and 27 through the surface of the passivation film 28.

SUMMARY OF THE INVENTION

Therefore, an object of the present invention is to provide a semiconductor IC device which does not incur a decrease in the dielectric strength by a leakage current flowing over the surface of the semiconductor device.

A semiconductor IC device comprising a semiconductor chip including at least a first function region, a second function region, and a third function region, wherein a current flowing through the third function region is controlled by an electric signal input to the first function region; and a first and a second pad provided on a surface of the semiconductor chip and serving as electric connectors for the first and second function regions, wherein in the semiconductor chip, when there is no electric signal input to the first function region, a depletion layer is so formed as to surround the first and second function regions between the first and second function regions, and the third function region, and wherein in order to improve the dielectric strength between the first and second function regions, and the third function region, the first and second pads are arranged close to each other substantially in the center of the surface of the semiconductor chip.

According to the present invention, by locating the first and second pads to the central portion of the semiconductor chip surface so as to be remote from the peripheral edge, the space between the peripheral edge of the semiconductor chip, and the first and second pad can be made larger than before.

Therefore, according to the present invention, dielectric breakdown by a surface leakage current can be prevented securely.

The present invention can be applied to MOS FETs and bipolar transistors.

In the semiconductor IC device according to the present invention, a dual well structure is preferably adopted in which the first function portion is formed by a first well portion and a second well portion is nested in the first well portion.

A plurality of cells, each of this dual well structure, may be so arranged as to surround the first and second pads.

The portion whereby to improve the dielectric strength is preferably formed of a field plate structure to manufacture a semiconductor IC device in a compact form.

DESCRIPTION OF THE PREFERRED EMBODIMENTS

The features of the present invention will be more apparent from the following description of embodiments depicted in the accompanying drawings.

Figure 1:
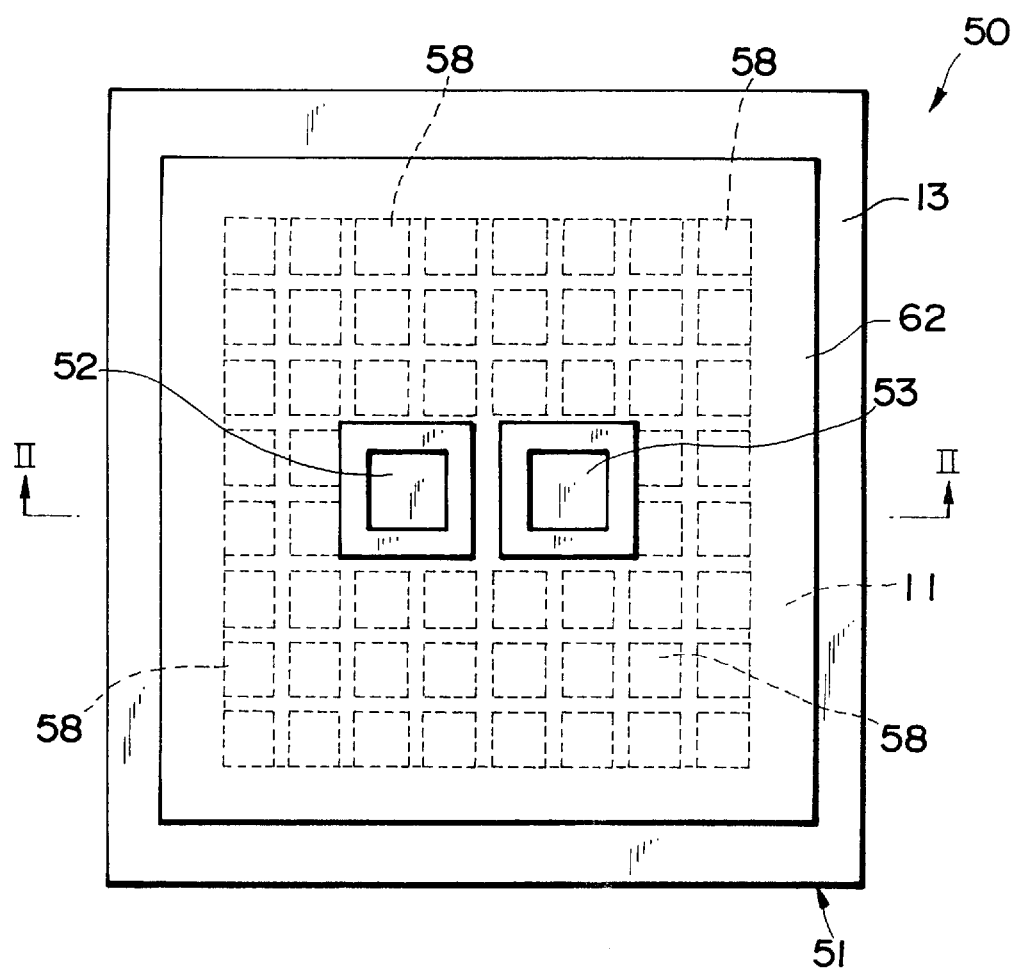
FIG. 1 is a plan view schematically showing the basic structure of the semiconductor IC device according to the present invention.
Figure 2A:
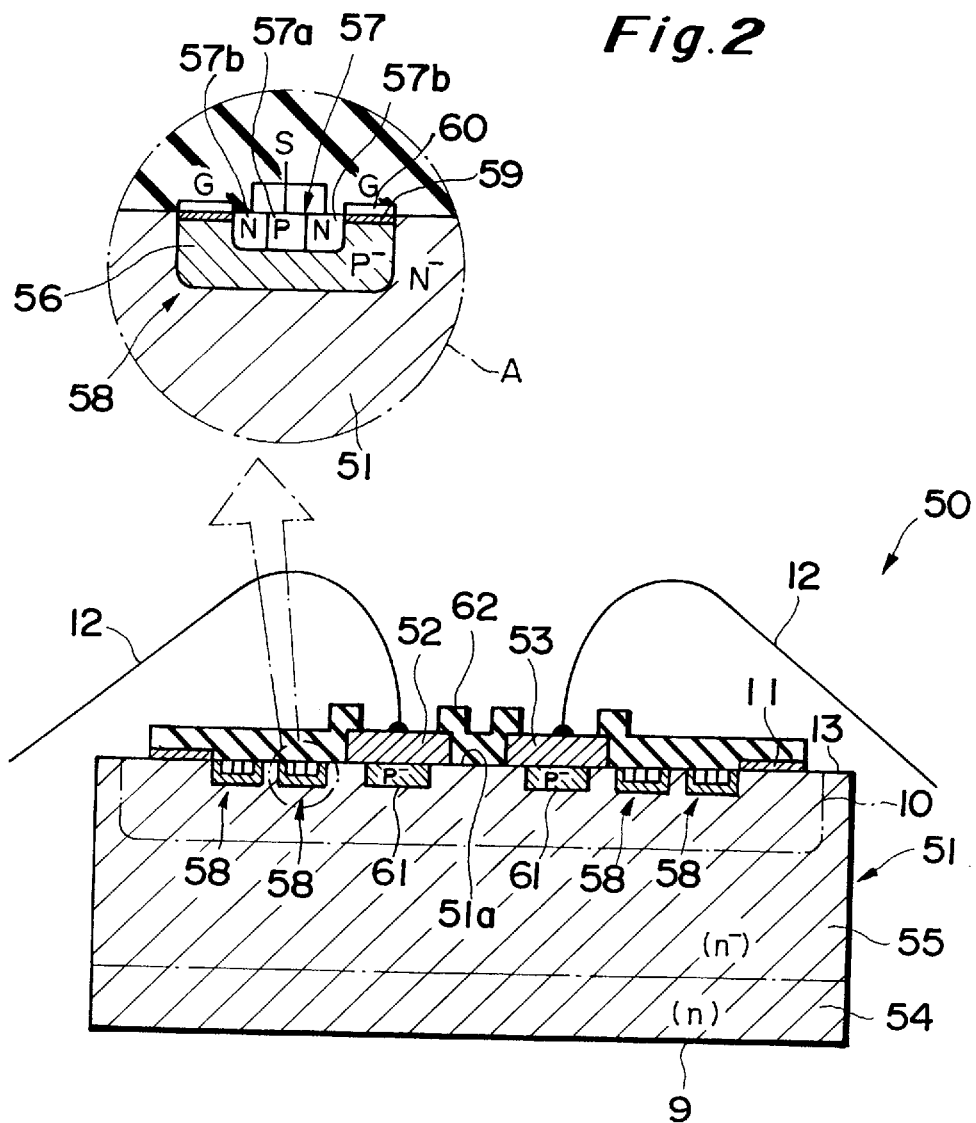
FIG. 2 is a cross sectional view taken along the lines II—II in FIG. 1.
Figure 5:
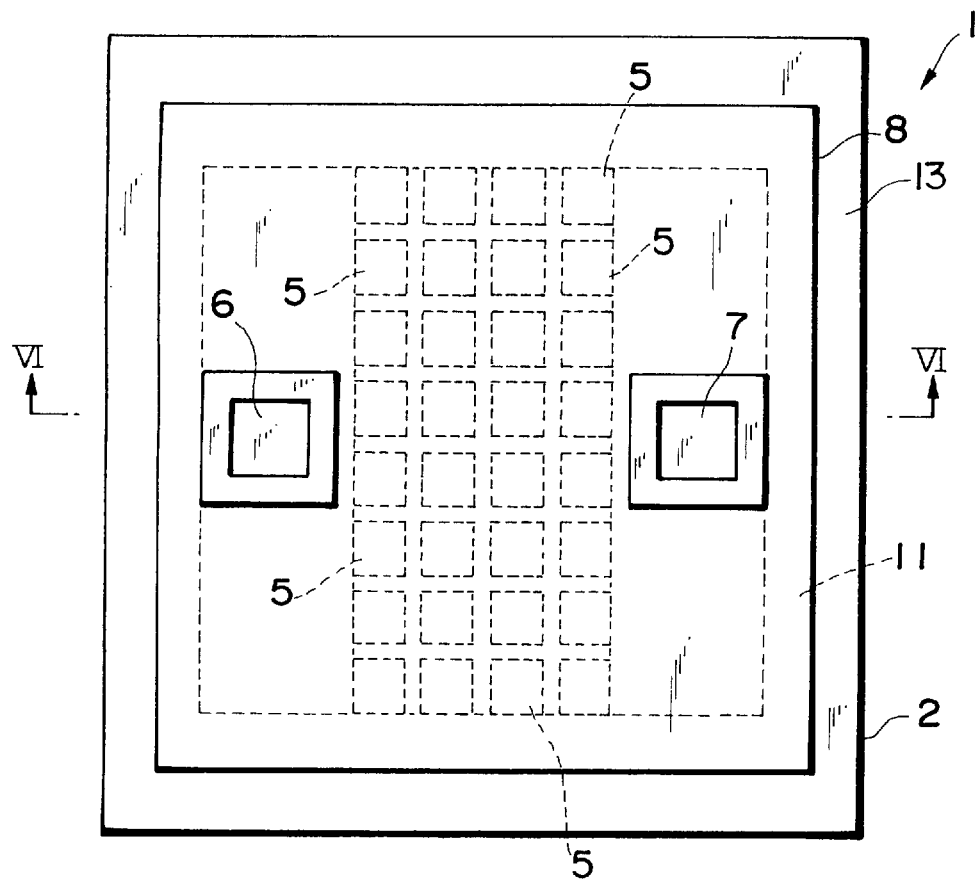
FIG. 5 is a drawing, similar to FIG. 1, showing a conventional semiconductor device.
Figure 6:
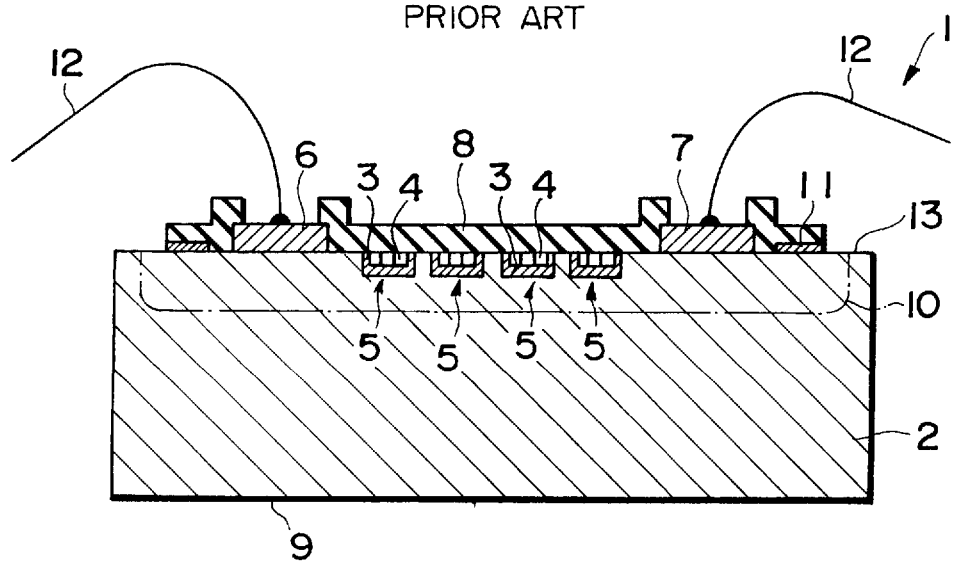
FIG. 6 is a cross sectional view taken along the lines VI—VI in FIG. 5.

FIGS. 1 and 2 show examples in which the present invention is applied to a high-power high-dielectric strength VDMOS like the one shown in FIGS. 5 and 6, and in FIGS. 1 and 2, the elements identical with those in FIGS. 5 and 6 are designated by the same reference numerals.

As shown in FIGS. 1 and 2, the VDMOS FET 50 according to the present invention comprises a semiconductor chip 51, and a pair of pads 52 and 53 formed on the semiconductor chip 51. The semiconductor chip 51 is obtained by growing an $n^-$-type silicon epitaxial layer 55 on an n-type silicon crystal substrate, for example.

In the surface 51a of the semiconductor chip 51, a plurality of cells 58 are provided which are of a dual well structure including a first well portion 56 (see FIG. 2) and a second well portion 57 (see FIG. 2) in the first well portion 56, successively formed by double diffusion of impurities into the substrate 51 as is conventionally done.

As is apparent from a partial sectional view indicated by the symbol A and showing a cell 58 on an enlarged scale in FIG. 2, the first well portion 56 has a polarity (p) opposite from that of the substrate 51. In the second well portion 57, its central part 57a shows the same polarity as the first well portion 56, and the two side parts 57b show a polarity (n) opposite from that of the first well portion 56.

The first well portion 56 serves as the first function region, and has a gate 60 deposited on its top surface through the intermediary of a gate oxide film 59. When a voltage as an electric signal is applied to the gate 60, in the first well portion 56, a channel is formed to electrically connect the second well portion 57 to the drain region 51 composed of the body of the substrate 51 which serves as the third function region as is conventionally done.

The gates 60 of the respective cells 58 are collectively connected to the pad 52 through a conductive means, not shown, which has conventionally been used and is here omitted for simplicity of the drawing.

The second well portion 57 serves as the second function region. Being in contact on its side parts 57b with the first well portion 56, the second function region is electrically connected through the channel to the substrate 51, which is the drain region, and therefore functions as the source region. The central part 57a serves to increase the dielectric strength between the source and the drain, and by connecting to the first well portion 56, prevent an electric stray in the first well portion 56.

The second well portions 57, that is, the source regions 57 are collectively connected to the pad 53 through a conductive means, not shown, which is conventionally used.

The pads 52 and 53 having the gates 60 and the sources 57 of a plurality of cells 58 collectively connected thereto are arranged close to each other substantially in the center of that surface 51a of the substrate 51 where the cells 58 are provided.

Those cells 58 are arranged in such a manner as to surround this pair of pads 52 and 53.

On the reverse side of the substrate 51, a drain electrode 9 is provided, while on the top surface of the substrate 51, a bonding wire 12, same as the one conventionally used, extends from each of the pads 52 and 53.

When a predetermined voltage is applied between the drain electrode 9 and the source pad 53 but no voltage is applied to the gate pad 52, the depletion layer 10 to secure the dielectric strength between drain and source is formed between the cells 58 and the drain in such a manner as to surround all cells 58 in the substrate 51. The p-well portions 61 are provided under the pads 52 and 53 to expand the depletion layer 10 to thereby increase the dielectric strength of the device.

On the surface 51a of the substrate 51, a conventional passivation film 62 is deposited which leaves the grid line 13 as well as the pads 52 and 53 exposed Moreover, in order to improve the dielectric strength, a conventional field plate 11 is arranged along and beneath the peripheral area of the passivation film 62 and above the surface 51a of the substrate 51.

As means to improve the dielectric strength, for example, a guard ring structure may be adopted, but a field plate 11 is to be preferably adopted to make a VDMOS FET 50 in a compact size.

In the case of a VDMOS FET 50 according to the present invention, for example, the source and gate are grounded, and a voltage of 1000 V is applied to the drain. In the VDMOS FET 50, due to the presence of the depletion layer 10 to secure the dielectric strength between the drain and the source, even if a predetermined voltage higher than 1000 V as mentioned above, for example, is applied between the drain and the source, while no voltage is applied to the gate pad 52, a leakage current does not occur between drain and source in the substrate 51, so that a decrease in the dielectric strength by a leakage current does not occur, which used to occur in the past.

Moreover, in the VDMOS FET 50, a pair of the pads 52 and 53 are arranged in the center of the surface 51a of the substrate 51 remote from the grid line 13 which is the exposed area at the periphery of the substrate 51. Therefore, the occurrence of a leakage current as in the past can be certainly prevented, which flows over the surface of the passivation film 62 between the grid line 13 and the pad 52 or between the grid line 13 and the pad 53.

Therefore, the decrease in the dielectric strength due to a leakage current between the drain and the source or between drain and gate over the surface of the semiconductor IC device 50 can be certainly prevented, thus improving the dielectric strength of the device.

Therefore, sufficient dielectric strength can be secured despite the down-sizing of the circuit board 51 by high density device integration.

Figure 3:
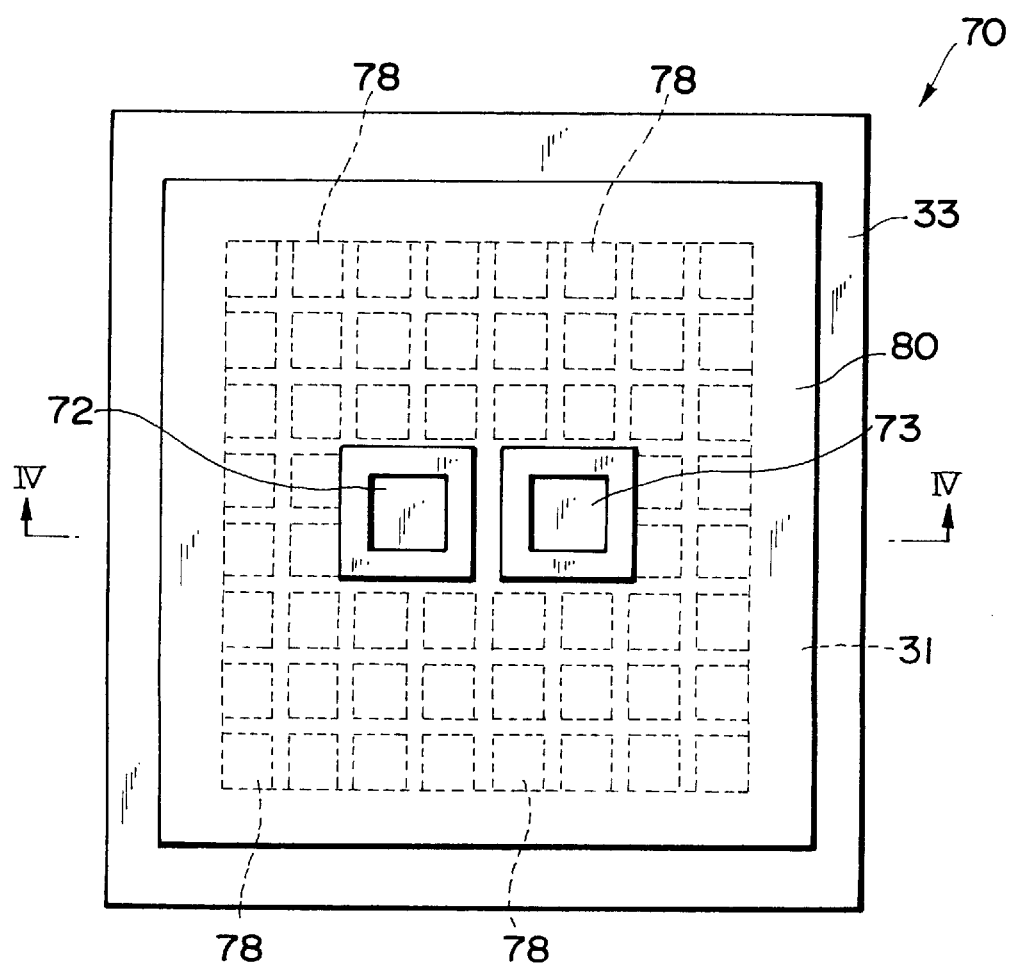
FIG. 3 is a plan view schematically showing the basic structure of another semiconductor IC device according to the present invention.
Figures 4, 4A:
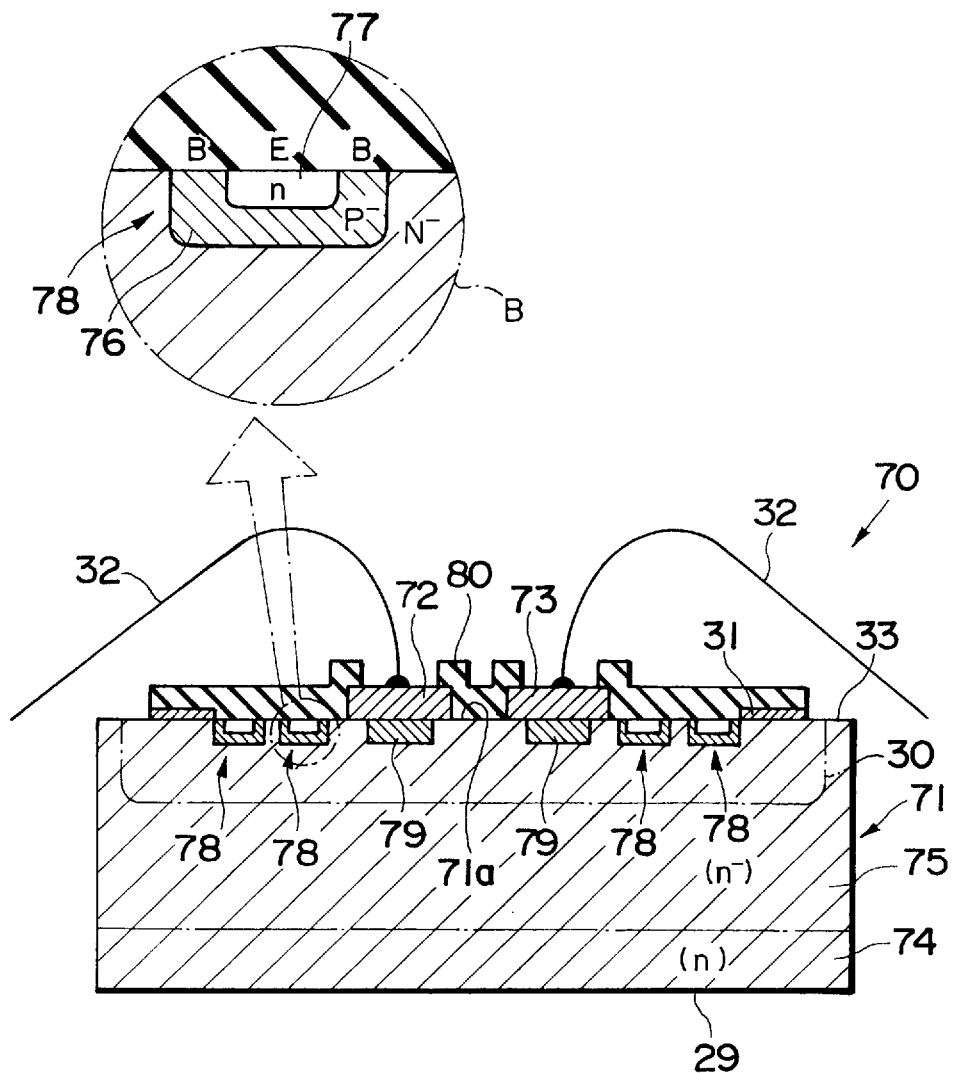
FIG. 4 is a cross sectional view taken along the lines III—III in FIG. 3.
Figure 7:
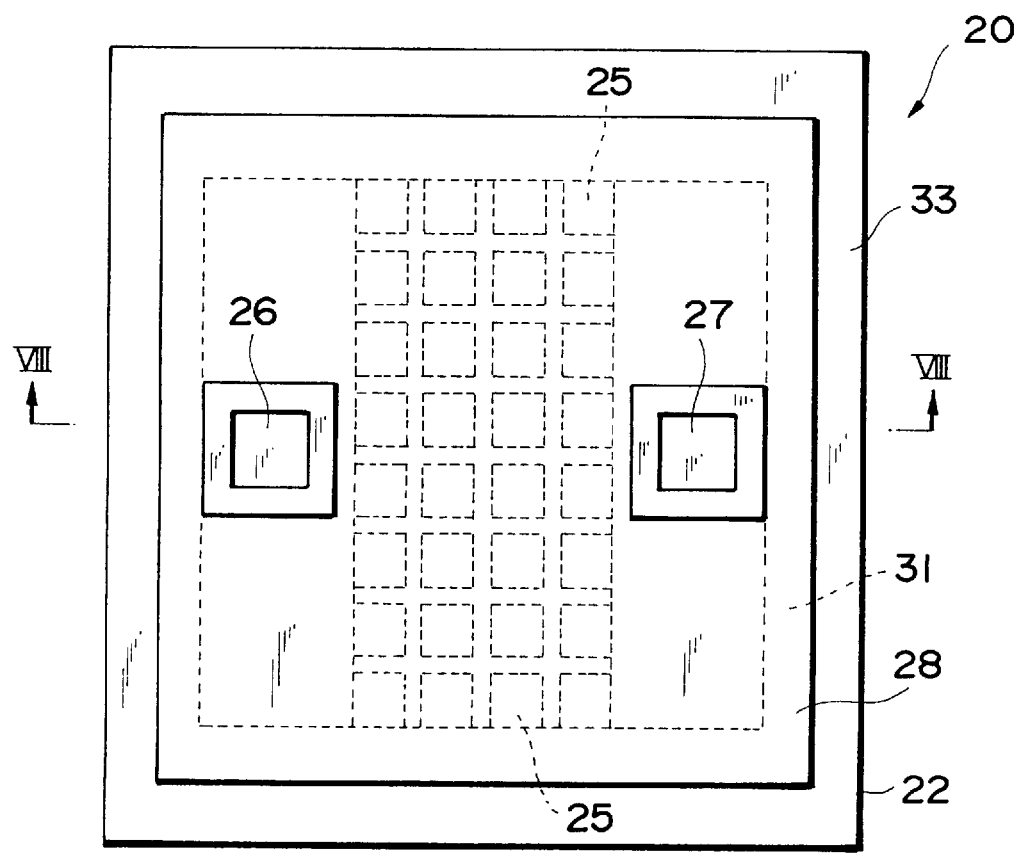
FIG. 7 is a drawing, similar to FIG. 3, showing another conventional semiconductor IC device.
Figure 8:
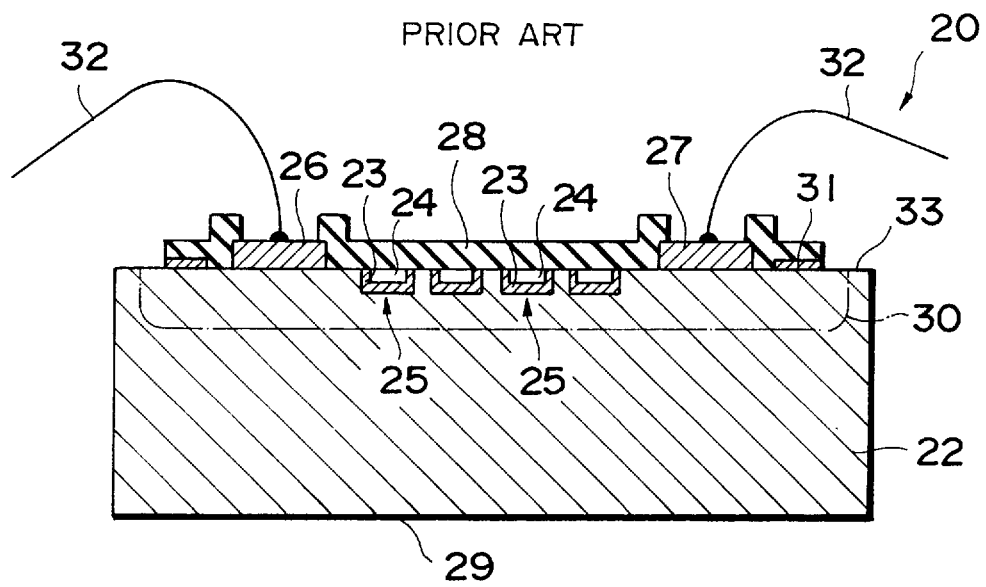
FIG. 8 is a cross sectional view taken along the VIII—VIII in FIG. 7.

FIGS. 3 and 4 show an example in which the present invention is applied to a high-dielectric-strength bipolar transistor similar to the one shown in FIGS. 7 and 8. The elements identical with those in FIGS. 7 and 8 are designated by the same reference numerals.

A high-dielectric-strength bipolar transistor 70 according to the present invention comprises a semiconductor chip 71, and a pair of pads 72 and 73 formed on the semiconductor chip 71 as shown in FIGS. 3 and 4. The semiconductor chip is obtained by growing an n⁻-type silicon epitaxial layer 75 on an n-type silicon crystal substrate 74, for example.

In the surface 71a of the semiconductor chip 71, a plurality of cells 78 are provided which are of a dual well structure including a first well portion 76 (see FIG. 4) and a second well portion 77 (see FIG. 4) in the first well portion, successively formed by double diffusion of impurities into the substrate 71 as is conventionally done.

As is apparent from a partial sectional view indicated by the symbol B and showing a cell 78 on an enlarged scale in FIG. 4, the first well portion 76 has a polarity (p) opposite from that of the substrate 71. The second well portion 77 shows a polarity (n) opposite from that of the first well portion 76.

The first well portion 76, which is the first function region, serves as a base. The second well portion 77, which is the second function region, serves as an emitter. The third function region composed of the body of the substrate 71 serves as a collector, and on the reverse side of the substrate 71, a collector electrode 29 is formed.

The bases 76 of the respective cells 78 are collectively connected to the pad 72 through a conductive means, not shown, which has conventionally been used and is here omitted for simplicity of the drawing. The emitters of the respective cells 78 are collectively connected to the pad 73 through a conductive means, not shown, which has conventionally been used.

The pads 72 and 73 having the bases 76 and the emitters 77 of a plurality of cells 78 collectively connected thereto are arranged close to each other substantially in the center of that surface 71a of the substrate 71 where the cells 78 are provided.

Those cells 78 are arranged in such a manner as to surround this pair of pads 72 and 73. A bonding wire 32 same as the one conventionally used extends from each of the pads 72 and 73.

When each transistor 70 of the p-n-p type has its base grounded, for example, and a current does not flow from base to emitter, a depletion layer 30 to ensure the collector-base dielectric strength is formed between the cells and the collector in such a way as to surround all cells 78 in the substrate 71. The p-well portions are provided under the pads 72 and 73 to expand the depletion layer 30 to thereby increase the dielectric strength of the device.

On the surface 71a of the substrate 71, a conventional passivation film 80 is deposited which leaves the grid line 33 as well as the pads 72 and 73 exposed. Moreover, in order to improve the dielectric strength, a conventional field plate 31 is arranged along and beneath the peripheral area of the passivation film 80 and above the surface 71a of the substrate In the transistor 70 according to the present invention, if it is used in a common-base arrangement, for example, by controlling the supply of the base current to the base-emitter junction, the collector current can be controlled. When the base current is off, the depletion layer 30 to secure the dielectric strength exists. Therefore, even when a predetermined voltage in excess of 1000 V, for example, is applied between the collector and the emitter, a leakage current does not occur between collector and emitter in the substrate 71, so that a decrease in the dielectric strength by a leakage current does not come to pass, which used to be a problem in the past.

Moreover, in the transistor 70, a pair of the pads 72 and 73 are arranged in the center of the surface 71a of the substrate 71 remote from the grid line 33 which is the exposed area at the periphery of the substrate 71. Therefore, the occurrence of a leakage current as in the past can be certainly prevented, which flows over the surface of the passivation film 80 between the grid line 33 and the base pad 72 or between the grid line 33 and the emitter pad 73.

Therefore, the decrease in the dielectric strength due to a collector-base leakage current between the base pad 72 and the grid line 33 or between the emitter pad 73 and the grid line 33 over the surface of the semiconductor IC device 70 can be certainly prevented, thus improving the dielectric strength of the device.

Therefore, sufficient dielectric strength can be secured despite the down-sizing of the circuit board 71 by high density device integration.

Description has been made of the examples where the present invention is applied to a high-dielectric-strength VDMOS FET and a high-dielectric-strength bipolar transistor as a semiconductor IC device with a high dielectric strength. The present invention is not limited to those examples, but can be applied to other various types of high-dielectric-strength semiconductor IC devices, such as an insulated gate FET (IGFET), and a lateral double-diffused MOS FET (LDMOS) in which the drain electrode is provided on the top surface of an IC chip where the source pad and the drain pad are formed.

The manufacturing process of the semiconductor IC device, the polarity and material of the semiconductor chip, the number of pads, the connection arrangement of the respective function regions, the applied voltages, etc. in the embodiments described above can be selected as you think suitable.

What is claimed is:

1. A semiconductor IC device comprising a semiconductor chip including at least a first function region, a second function region, and a third function region, wherein a current flowing through the third function region is controlled by an electric signal input to the first function region; and a first and a second pad provided on a surface of the semiconductor chip and serving as electric connectors for the first and second function regions, wherein in the semiconductor chip, when there is no electric signal input to the first function region, a depletion layer is so formed as to surround the first and second function regions and between the first and second function regions, and the third function region, and wherein the first and second pads are arranged adjacent to each other substantially in a longitudinal and latitudinal center of the surface of the semiconductor chip.

2. A semiconductor IC device according to claim 1, wherein a plurality of cells are provided, each with a dual well structure including a first well portion constituting the first function region and a second well portion constituting the second function region in the first well portion, and wherein the plurality of cells are so arranged as to surround the first pad and the second pad.

3. A semiconductor IC device according to claim 1, further comprising a passivation film covering the surface of the semiconductor chip with the first and second pads exposed and a peripheral area of the semiconductor chip also exposed; and a field plate structure, provided between the passivation film and the surface of the semiconductor chip, for improving a dielectric strength by the depletion layer.

4. A semiconductor IC device according to claim 1, wherein a gate is formed on the first function region through a gate oxide film acting as an intermediary, the second function region is a source, the third function region is a drain, the first pad is a gate pad, the second pad is a source pad, and the semiconductor IC device is a MOS FET in which a drain-source current is controlled by a gate voltage applied to the gate.

5. A semiconductor IC device according to claim 4, wherein the MOS FET is a DMOS FET having at least one dual well structure including a first well portion in the semiconductor chip constituting the first function region and a second well portion constituting the second function region in the first well portion, successively formed by double diffusion of impurities into the semiconductor chip.

6. A semiconductor IC device according to claim 5, wherein the DMOS FET is a VDMOS including the gate formed in the first well portion, the source formed in the second well portion, the drain formed in that portion of the semiconductor chip which is outside the depletion layer surrounding the first and second well portions, and wherein an electrode for the drain is formed on a reverse side of the semiconductor chip.

7. A semiconductor IC device according to claim 6, wherein a plurality of cells having gates and sources are so arranged as to surround the first and second pads, and wherein the gates and the sources are connected collectively to the first pad and the second pad, respectively.

8. A semiconductor IC device according to claim 2, wherein the first function region is a base, the second function region is an emitter and the third function region is a collector, wherein the first pad is a base pad and the second pad is an emitter pad, and wherein a base-collector current is controlled by a current supplied between the base and the emitter.

9. A semiconductor IC device according to claim 8, wherein a plurality of cells are provided, each with a dual well structure including a first well portion in the semiconductor chip, and a second well portion in the first well portion, successively formed by a double diffusion of impurities into the semiconductor chip, and wherein the base is formed in the first well portion, the emitter is formed in the second well portion, and the collector is that portion of the semiconductor chip which is outside the depletion layer surrounding the second well portions and an electrode for the collector is formed on the semiconductor chip.

10. A semiconductor IC device according to claim 9, wherein the cells are so arranged as to surround the base pad and the emitter pad.

11. A semiconductor IC device comprising a semiconductor chip including at least a first function region, a second function region, and a third function region, wherein a current flowing through the third function region is controlled by an electric signal input to the first function region; and a first and a second pad provided on a surface of the semiconductor chip and serving as electric connectors for the first and second function region, wherein the first and second pads are arranged substantially in a center of the surface of the semiconductor chip, and wherein a distance between the first and second pads is shorter than a distance between at least one of said first and second pads and a peripheral area of the semiconductor chip.

12. A semiconductor IC device according to claim 11, wherein in the semiconductor chip, when there is no electric signal input to the first function region, a depletion layer is so formed as to surround the first and second function regions and between the first and second function regions, and the third function region, and further comprising a passivation film covering the surface of the semiconductor chip with the first and second pads exposed and a peripheral area of the semiconductor chip also exposed; and a field plate structure, provided between the passivation film and the surface of the semiconductor chip, for improving a dielectric strength by the depletion layer.

13. A semiconductor IC device according to claim 12, wherein a gate is located on a gate oxide film on the first region, the second function region is a source, the third function region is a drain, the first pad is a gate pad, the second pad is a source pad, and the semiconductor IC device is a MOS FET in which a drain-source current is controlled by a gate voltage applied to the gate.

14. A semiconductor IC device according to claim 12, wherein a plurality of cells are provided, each with dual well structure including a first well portion constituting the first function region and a second well portion constituting the second function region in the first well portion, and wherein the plurality of cells are so arranged as to surround the first pad and the second pad.

15. A semiconductor IC device according to claim 14, wherein a gate is located on a gate oxide film on the first region, the second function region is a source, the third function region is a drain, the first pad is a gate pad, the second pad is a source pad, and the semiconductor IC device is a MOS FET in which a drain-source current is controlled by a gate voltage applied to the gate.

16. A semiconductor IC device according to claim 15, wherein the MOS FET is a DMOS FET having at least one dual well structure including a first well portion in the semiconductor chip and a second well portion in the first well portion, successively formed by double diffusion of impurities into the semiconductor chip.

17. A semiconductor IC device according to claim 16, wherein the DMOS FET is a VDMOS including the gate formed in the first well portion, the source formed in the second well portion, the drain formed in that portion of the semiconductor chip which is outside the depletion layer surrounding the second function portions, and wherein an electrode for the drain is formed on a reverse side of the semiconductor chip.

18. A semiconductor IC device according to claim 17, wherein a plurality of cells having gates and sources are so arranged as to surround the first and second pads, and wherein the gates and the sources are connected collectively to the first pad and the second pad, respectively.

19. A semiconductor IC device according to claim 13, wherein the first function region is a base, the second function region is an emitter and the third function region is a collector, wherein the first pad is a base pad and the second pad is an emitter pad, and wherein a base-collector current is controlled by a current supplied between the base and the emitter.

20. A semiconductor IC device according to claim 19, wherein a plurality of cells are provided, each with dual well structure including a first well portion in the semiconductor chip, and a second well portion in the first well portion, successively formed by a double diffusion of impurities into the semiconductor chip, and wherein the base is formed in the first well portion the emitter is formed in the second well portion, and the collector is that portion of the semiconductor chip which is outside the depletion layer surrounding the second well portion and an electrode for the collector is formed on a reverse side of the semiconductor chip.

21. A semiconductor IC device according to claim 20, wherein the cells are so arranged as to surround the base pad and the emitter pad.

* * * * *